(12) United States Patent
Brinkmann et al.

(10) Patent No.: US 11,422,467 B2
(45) Date of Patent: Aug. 23, 2022

(54) APPARATUS AND METHOD FOR DEVELOPING PRINTING PRECURSORS

(71) Applicant: Flint Group Germany GmbH, Stuttgart (DE)

(72) Inventors: Axel Brinkmann, Renningen (DE); Gernot Dietz, Eisenberg (DE)

(73) Assignee: Flint Group Germany GmbH, Stuttgart (DE)

( * ) Notice: Subject to any disclaimer, the term of this patent is extended or adjusted under 35 U.S.C. 154(b) by 46 days.

(21) Appl. No.: 16/768,680

(22) PCT Filed: Dec. 7, 2018

(86) PCT No.: PCT/EP2018/084009
§ 371 (c)(1),
(2) Date: May 31, 2020

(87) PCT Pub. No.: WO2019/110814
PCT Pub. Date: Jun. 13, 2019

(65) Prior Publication Data
US 2021/0063886 A1    Mar. 4, 2021

(30) Foreign Application Priority Data

Dec. 8, 2017 (EP) .................................. 17206226

(51) Int. Cl.
*G03F 7/30* (2006.01)
*B41N 1/12* (2006.01)

(52) U.S. Cl.
CPC ............. *G03F 7/3057* (2013.01); *B41N 1/12* (2013.01); *G03F 7/3035* (2013.01)

(58) Field of Classification Search
None
See application file for complete search history.

(56) References Cited

U.S. PATENT DOCUMENTS

| 4,196,018 A | 4/1980 | Inoko et al. |
| 5,176,986 A | 1/1993 | Telser et al. |
| (Continued) | | |

FOREIGN PATENT DOCUMENTS

| EP | 0332070 A2 | 9/1989 |
| EP | 0433374 A1 | 6/1991 |
| (Continued) | | |

OTHER PUBLICATIONS

International Search Report and Written Opinion received for PCT Patent Application No. PCT/EP2018/084009, dated Mar. 7, 2019, 10 pages.

*Primary Examiner* — Joshua D Zimmerman
(74) *Attorney, Agent, or Firm* — Faegre Drinker Biddle & Reath LLP

(57) ABSTRACT

The present invention relates to an apparatus (10) for developing printing precursors (11) comprising a developing station (20) comprising a rotating drum (22) having a fixation mechanism (24) for the precursor (11) and at least one brush (26). The apparatus (10) further comprises a pre-cleaning station (30) and a first transport mechanism (12), the first transport mechanism (12) being configured for transporting the precursor (11) through the pre-cleaning station (30) and, after the precursor (11) has passed the pre-cleaning station (30), to the developing station (20). Further aspects relate to a method for developing a printing precursor using such an apparatus.

18 Claims, 1 Drawing Sheet

(56) References Cited

U.S. PATENT DOCUMENTS

| | | | |
|---|---|---|---|
| 2001/0038975 | A1 | 11/2001 | Daems et al. |
| 2007/0256585 | A1 | 11/2007 | Zanoli et al. |
| 2012/0237871 | A1 | 9/2012 | Zwadlo |
| 2016/0229172 | A1* | 8/2016 | Stebani ............... G03F 7/092 |

FOREIGN PATENT DOCUMENTS

| | | |
|---|---|---|
| FR | 2543886 A1 | 10/1984 |
| GB | 2310166 A | 8/1997 |
| JP | 2002-311599 A | 10/2002 |
| WO | 90/02359 A1 | 3/1990 |
| WO | 92/01568 A1 | 2/1992 |
| WO | 2016/030450 A1 | 3/2016 |

\* cited by examiner

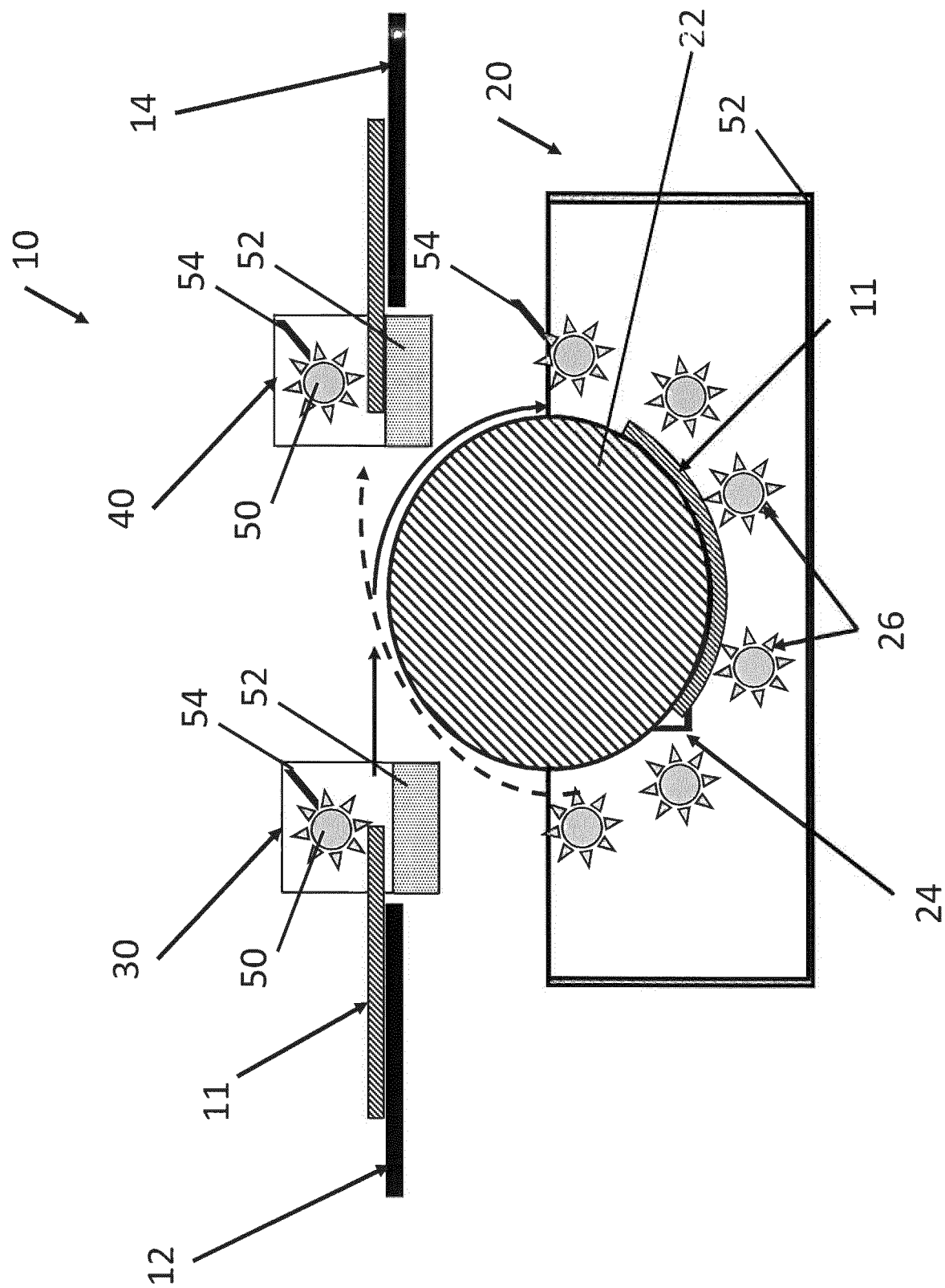

APPARATUS AND METHOD FOR DEVELOPING PRINTING PRECURSORS

CROSS-REFERENCE TO RELATED APPLICATIONS

This application is a national stage application (under 35 U.S.C. § 371) of PCT/EP2018/084009, filed Dec. 7, 2018, which claims benefit of European Application No. 17206226.7, filed Dec. 8, 2017, both of which are incorporated herein by reference in their entirety.

The present invention relates to an apparatus for developing printing precursors comprising a developing station comprising a rotating drum having a fixation mechanism for the precursor and at least one brush. Further aspects relate to a method for developing a printing precursor using such an apparatus.

Examples of suitable printing precursors are flexographic printing precursors and letter press printing precursors.

Digitally imageable flexographic printing elements are known in the art. They comprise at least one dimensionally stable support, a photopolymerizable layer, and a digitally imageable layer. The digitally imageable layer may be, for example, a laser-ablatable layer, a layer which can be applied using inkjet printers, or a thermographic layer; the most commonplace are laser-ablatable layers, also called LAMS (laser-ablatable mask system) layers.

Starting from photopolymerizable, digitally imageable flexographic printing elements, flexographic printing plates are produced by means of a multistage operation, using corresponding devices for each method step.

First of all a mask is written into the digitally imageable layer, for example by using an IR laser. This may involve laser apparatus with a rotating drum, flat bed apparatus, or internal drum lasers.

Following the generation of the mask, the flexographic printing element is exposed through the mask formed, with electromagnetic radiation, preferably UV radiation or UV/VIS radiation. The photopolymerizable layer undergoes polymerization and/or crosslinking in the regions no longer concealed by the mask, while in the concealed regions there is no polymerization or crosslinking. UV exposure units used for this purpose may comprise various UV sources, examples being UV tubes or UV-LEDs.

Following exposure, a developing step is performed wherein the residues of the mask and also the unpolymerized fractions of the photopolymerizable layer are removed. This may be done using one or more solvents or else thermally. For washout by means of solvent, specialty washout equipment is used, examples being brush washers. For thermal development it is possible to use equipment in which an absorbent nonwoven web is pressed by a heated roller onto the exposed layer.

When solvents are used to develop the plate, there usually follows a drying step in a dryer.

After the drying, the surface of the resulting flexographic printing plate is customarily post treated, by exposure of the surface with UVA and/or UVC radiation, for example. For this, again, corresponding exposure apparatus is used.

U.S. Pat. No. 5,176,986 A discloses a process for preparing a flexographic printing plate which comprises a photopolymerizable relief-forming layer and a light sensitive recording layer. The unpolymerized parts of the relief-forming layer as well as the light sensitive recording layer are removed after image wise irradiation of the relief-forming layer. This development step is carried out in a drum brush washer with a liquid cleaning composition.

There are a number of publications which describe machines that use a rotating drum for producing printing plates, in which one liquid is used and the pates are attached to the drum manually, e.g. WO 1992/001568A1, U.S. Pat. No. 4,196,018 A, GB 2310166 A, JP 2002311599 A and FR 2543886 A1. The manual plate feeding is tedious and the cleanliness of the plates after processing is insufficient.

US 2007/0256585A1 describes a machine with a rotating drum and one brush which may be used with two different solvents which may be applied subsequently. However the same brush is used with both solvents and contamination of the solvents occurs which reduces the quality of the plates over time.

WO 2016/030450 A1 discloses an apparatus for producing flexographic printing plates from flexographic printing elements that can be provided with digital images. The apparatus makes it possible to carry out in an automated manner at least the method steps of exposing the rear side, a main exposing process, developing the plates using washout substances, drying and after-treating the plates. The disclosed apparatus may comprise a washout unit having two separate washing zones. One disadvantage of the described apparatus is its large size.

For a good image reproduction it is vital to completely remove the laser-ablatable layer and leave no residues on the relief. Due to the fact that the laser-ablatable layer is made from different materials than the photopolymer layer also the dissolution characteristics are different. Hence the best solubility and cleaning action is achieved by using different well suited solvents for each of the layers. In addition solubility of polymers and other ingredients of the layers strongly depend on temperature. In general the solubility is enhanced with increasing temperature but some polymer exhibit mixing gaps or reduced solubility when the temperature is increased. In addition the contamination of one of the solvents with the other may lead to precipitation of the dissolved, emulsified or dispersed material removed from the precursor which may lead to clogging of pumps or filters. Therefor there is a need for equipment which is able to treat digital printing plates using two solvents at two different temperatures with complete removal of the laser ablative layer and with reduced contamination of the solvents.

The above tasks are solved by providing an apparatus for developing printing precursors. The apparatus comprises a developing station, the developing station comprises a rotating drum having a fixation mechanism for the precursor and at least one first brush, wherein the apparatus further comprises a pre-cleaning station, a first transport mechanism and a second transport mechanism, the first transport mechanism being configured for transporting the precursor through the pre-cleaning station and, after the precursor has passed the pre-cleaning station, to the rotating drum of the developing station. The apparatus is further configured to attach one or several precursors to the rotating drum by means of the fixation mechanism, to rotate the rotating drum at least once, preferably 1 to 50 times during developing, to release a fixation of the one or several precursors on the rotating drum after developing has finished, and, after the fixation has been released, to move the one or several precursors towards the second transportation mechanism while rotating the rotating drum.

A BRIEF DESCRIPTION OF THE FIGURE

FIG. 1 shows a schematic view of an embodiment of the inventive apparatus.

The printing precursors are preferably configured as plate-form printing elements. Such printing elements are flexible sheets which are essentially flat when placed on a flat surface. As the printing precursors are flexible, they may be wound around the surface of the rotating drum of the developing station. Preferably, the plate-form printing elements are flexographic printing elements.

The apparatus may additionally comprise at least one post-processing station selected from the group comprising a post-cleaning station, a wiping station, drying station, post exposure station, storage station, cutting station and combinations thereof, the second transport mechanism being configured for transporting the precursor from the developing station through the at least one post-processing station.

Preferably the pre-cleaning station and/or the post-cleaning station are configured as flatbed washers.

Preferably, the pre-cleaning station, the developing station and/or the post-cleaning station comprise a dispensing unit, wherein the pre-cleaning station, the developing station and/or the post cleaning station have liquid handling systems which are independent from each other or comprise a common liquid handling system. The possibility to have two to three different liquid handling systems is advantageous because each step may be controlled separately and can be adapted to the specific needs of the corresponding step. Not only the liquid can be selected but also the processing time and intensity can be adapted and this may lead to shorter processing times.

Preferably, the pre-cleaning station, the developing station and/or the post-cleaning station comprise heating and/or cooling means constructed such that a temperature of a liquid in the respective station may be controlled independently from other stations.

Preferably, the pre-cleaning station and/or the post-cleaning station comprise at least one unit selected from the group comprising at least one further brush, a knife, an air knife, a grinding unit, a rotary cutter, a squeeze unit, an ultrasonic bath and combinations thereof.

The pre-cleaning station and/or the post-cleaning station may comprise at least a front brush and a back brush, wherein the front brush is arranged to contact a front side of the precursor and the back brush is arranged to contact an opposing back side of the precursor.

Preferably, the at least one first brush of the developing station, the at least one further brush of the pre-cleaning station and/or the at least one further brush of the post-cleaning station is arranged such that a distance between the respective brush and the precursor and/or a pressure exerted by the respective brush onto the precursor is independently controllable.

Preferably, the at least one first brush of the developing station, the at least one further brush of the pre-cleaning station and/or the at least one further brush of the post-cleaning station is constructed as a rotating brush and/or an oscillating brush.

When a precursor is fed into the apparatus, the precursor is transported into the apparatus with the first transport mechanism which moves the precursor into the apparatus and through the pre-cleaning station to the rotating drum of the developing station. The first transport mechanism may comprise one or more transport rollers which transport the precursor by friction and such rollers may be fixed on above, underneath or both sides of the precursor. The first transportation mechanism may use a transport or clamping bar to which the precursor is attached. The transport bar may be moved by two endless chains that carry a fixation means for the transport bar. Another possibility is to use two rotating spindles in combination with the corresponding shape of the end of the transport bar. Another possibility is to use a conveyor belt onto which the precursor is attached to. The transport mechanism may also be any combination of the possibilities mentioned above. Preferably at least one transport roll is used as transport mechanism. The transport mechanism may be connected to a control system which steers the speed and action of the transport system. Preferably, the speed of the precursor moved by the first transport mechanism is 10 mm/min to 2000 mm/min, more preferably from 20 mm/min to 1500 mm/min, even more preferably from 50 mm/min to 1000 mm/min and most preferred from 100 mm/min to 1000 mm/min.

While the precursor is transported towards the developing station it passes the pre-cleaning station which preferably comprises at least a trough, a dispensing unit and a liquid handling system. The pre-cleaning station may comprise additionally at least one further brush, a knife, an air knife, a rotary cutter, a grinding unit, squeeze unit, ultrasonic bath and combinations thereof. The dispensing unit provides liquid to the at least one further brush and/or the surface of the precursor. The dispensing unit may use nozzles to spray the liquid also under increased pressure, but it could also simply drip it from hoses or slits. The dispensing unit is selected from the group comprising a spraying unit, a rinsing unit, curtain coating device, a tube or tray with openings and combinations thereof.

Preferably a spraying or rinsing unit is used. The dispensing unit may apply the liquid to the precursor and/or the at least one brush. Preferably the liquid is applied to the precursor before the precursor reaches the brush. Most of the liquid is applied to the brush which supports the removal of the material mechanically. The through is built and arranged in such a way that the liquid used in the pre-cleaning station is collected.

The knife, the air-knife and/or the squeeze unit may be used to remove liquid from the at least one brush and/or the precursor. An ultrasound generator may be installed in the trough and may be used without a brush when the precursor is immersed in the liquid while passing through the pre-cleaning station. Instead of or in addition to a brush also a rotary cutter or a grinding unit may be used.

The liquid handling system comprises at least a device to move the liquid to the dispensing unit and connection pipes. This device could be a pump or a Venturi pump. Additionally the liquid handling system may comprise a separation device (e.g. a filter or a centrifuge or a sedimentation means or floating means) to separate insoluble or dispersed material. The liquid handling system is typically connected to the trough and can also be used to release liquid from the system (e.g. via the trough) or to add fresh liquid to the system. The liquid handling system and its components may be connected to a control system which is used to steer them. Preferably, the liquid handling system of the pre-cleaning station is independent from other liquid handling systems of the apparatus.

The at least one further brush may be a single piece or an assembly of at least two brushes and is mounted such that it will treat the side of the precursor which carries the relief layer. Additional brushes may be placed at the same or the other side of the precursor. Preferably there is at least one brush, the front brush, mounted on the side of the precursor with the relief layer. More preferably there is an additional brush, the back brush mounted on the opposite side. The at least one further brush may be a rotating cylindrical brush or it may be a flat oscillating or rotating brush. Preferably it is a rotating brush. The brush may be a spiral brush, a segmented brush, a non-segmented brush or combinations thereof. The bristles of the brush may be oriented perpendicular to the brush body surface or may be inclined. The bristles may be aligned in straight or curved lines or bundles of bristles placed in regular or irregular pattern. The materials the bristle and the brush body are made of should withstand the liquids used and show only little change of their mechanical properties when in contact with the liquids. The bristles may be made from natural or artificial materials. These materials may be a metal, an alloy, a glass, a mineral, a natural or artificial polymer, a composite or a combination thereof. For example metal wire, glass fibers, animal hair, plant fibers or polymeric fibers or combinations thereof may be used and may have different hardness, strength or flexibility. Also the length, form (e.g. circular, elliptical or rectangular or hexagonal cross section) and bristle top shape (e.g. round or edged). Preferably the brush body is made of aluminum, stainless steel, bras, polyethylene, polyoxymethylene or combinations thereof. Preferably the bristles are made of polyamide (nylon), polyester or combinations thereof.

The at least one further brush, especially the front brush, is preferably mounted such that the position of the brush may be controlled by the control system and changed in order to be able to adapt the system for different precursor thicknesses or different pressure of the bristles onto the precursor. The brush is preferably moved by at least one motor and the motor is connected to a control system which is used to steer the rotation speed, time and/or number of rotations. In case of a rotating brush the direction of rotation may be the same or the opposite direction of the direction of the moving precursor. The surface speed of the rotating brush with respect to the speed of the moving precursor is preferably different. The direction and/or the absolute value of the speed may be different, wherein the difference in the absolute value of the surface speed of the precursor to the surface speed of the brush is in the range of from 1% to 200%. In case of an oscillating brush the oscillating speed of the brush is in the range of 1 and 50 oscillations per minute, preferably in the range of 10 to 40 oscillations per minute and more preferably in the range of 20 to 30 oscillations per minute.

The pre-cleaning system may also comprise at least one sensor which may be used to control a property of the liquid. The properties of the liquid to be controlled are selected form the group comprising the temperature, the viscosity, the pH, the solids content, the color, the turbidity, the density or a combination thereof. Preferably the temperature, the viscosity and/or the pH are measured. The temperature may be measured by e.g. liquid thermometer, a thermocouple, a thermistor, a Resistance Temperature Detector (RTD), a pyrometer or using infrared. The viscosity may be measured e.g. an Ostwald viscometers, a Höppler viscometer (falling ball), vibrational or rotating viscometers (Brookfield), a bubble viscometer, by determination of pressure loss within built in measuring circle or combinations thereof. The pH value may be measured by potentiometric pH meter. The at least one sensor may be connected to a control system which may use the measured data in a feedback loop to control the process. Viscosity and pH measurements may be used to determine when and how much of the liquid needs to be replaced in order to obtain consistent development. The pre-cleaning station may comprise a heating or cooling means constructed such that a temperature of a liquid in the respective station may be controlled independently from other stations.

Using a pre-cleaning station as described above wherein the liquid handling system is separated from the liquid handling system of the following developing station has the advantage, that contamination of the developing station with material from the imageable layer is reduced or omitted. A pre-cleaning station can be used to prevent contamination of the developer liquid with the IR absorbing materials typically contained in the imageable layer. This is especially important, when a first liquid is used in the pre-cleaning station which is ideally suited for the removal of the imageable layer but reduces the developing ability of the second liquid in the developing station or when the first liquid causes flocculation and/or precipitation of precursor material. This may be the case when water or aqueous solutions are used as one liquid and organic solvents are used as other liquid.

The developing station of the apparatus comprises a rotating drum which carries means for fixation of one or several precursors. The fixation mechanism is preferably selected from the group comprising a clamping mechanism, a holding unit for a transport bar, a vacuum system and combinations thereof. The fixation mechanism may be a clamping system with movable jaws which grab the plate and hold it. The fixation mechanism may use a clamping bar wherein the precursor is fixed and the clamping bar fits to holding devices mounted on the drum. Another possibility is to punch openings into the precursor which fit to pins mounted on the drum. The drum may also be equipped with a vacuum system and holes or slits in its surface to suck the precursor to the drum surface.

The drum is preferably moved by a motor which is connected to a control system which can control the rotation speed of the drum, the number of rotations, the direction of the rotation or combinations thereof. The speed of the drum is in the range of 0.01 rpm to 100 rpm, preferably 0.1 rpm to 50 rpm, more preferably from 1 rpm to 20 rpm and most preferred from 5 rpm to 10 rpm. The drum rotates at least once, preferably the number of rotations for a precursor is in the range of 1 to 50 rotations, more preferably from 10 to 40 rotations and most preferred from 20 to 30 rotations.

The developing station comprises at least on first brush which may be a rotating brush, especially a cylindrical rotating brush. The at least one first brush may be a single piece or an assembly of at least two brushes and is mounted such that it will treat the side of the precursor which carries the relief layer. Additional brushes may be placed around the rotating drum. The brush may be a spiral brush, a segmented brush, a non-segmented brush or combinations thereof. The bristles of the brush may be oriented perpendicular to the brush body surface or may be inclined. The bristles may be aligned in straight or curved lines or bundles of bristles placed in regular or irregular pattern. The materials the bristle and the brush body are made of should withstand the liquids used and show only little change of their mechanical properties when in contact with the liquids. The bristles may be made from natural or artificial materials. These materials may be a metal, an alloy, a glass, a mineral, a natural or artificial polymer, a composite or a combination thereof. For example metal wire, glass fibers, animal hair, plant fibers or polymeric fibers or combinations thereof may be used and may have different hardness, strength or flexibility. Also the length, form (e.g. circular, elliptical or rectangular or hexagonal cross section) and bristle top shape (e.g. round or edged). Preferably the brush body is made of aluminum, stainless steel, bras, polyethylene, polyoxymethylene or combinations thereof. Preferably the bristles are made of polyamide (nylon), polyester or combinations thereof.

The at least one first brush is preferably mounted such that the position of the brush may be controlled by the control unit and changed in order to be able to adapt the system for different precursor thicknesses or different pressure of the bristles onto the precursor. The at least one first brush is preferably moved by at least one motor and the motor is preferably connected to a control system which is used to steer the rotation speed, time and/or number of rotations. In case of a rotating brush the direction of rotation may be the same or the opposite direction of the direction of the moving precursor on the rotating drum. The surface speed of the rotating brush with respect to the speed of the moving precursor is preferably different. The direction and/or the absolute value of the speed may be different, wherein the difference in the absolute value of the surface speed of the precursor to the surface speed of the brush is in the range of from 1% to 200%.

The developing station may comprise a dispensing unit which provides liquid to the at least one first brush and/or the surface of the precursor. The dispensing unit may use nozzles to spray the liquid also under increased pressure, but it could also simply drip it from hoses or slits. Preferably, the dispensing unit is selected from the group comprising a spraying unit, a rinsing unit, curtain coating device, a tube or tray with openings and combinations thereof. Preferably a spraying or rinsing unit is used. The liquid may be applied to the precursor and/or the brush. Preferably the liquid is applied to the precursor before the precursor reaches the at least one first brush. Most of the liquid is applied to the at least one first brush which supports the removal of the material mechanically.

The developing station may comprise a through and it is built in a way that the liquid used in the developing station is collected. The drum and the at least one first brush are mounted above the through such that liquid may get into it by gravity. The drum and/or the brush may completely or partly be immersed in the liquid in the trough or they may not be immersed. Preferably the drum and the at least one first brush are not immersed. In case the drum and also the precursor are immersed in the liquid an ultrasound generator may be installed to enhance developing. In some cases the use of an ultrasound generator may make the action of the at least one first brush obsolete.

The developing station may comprise a liquid handling system. The liquid handling system comprises at least a device to move the liquid to the dispensing unit and connection pipes. This device could be a pump or a Venturi pump. Additionally the liquid handling system may comprise a separation device (e.g. a filter or a centrifuge or a sedimentation means or floating means) to separate insoluble or dispersed material. The liquid handling system is typically connected to the trough and can also be used to release liquid from the system (e.g. via the trough) or to add fresh liquid to the system. The liquid handling system and its components may be connected to a control system which is used to steer them. Preferably, the liquid handling system of the developing station is independent from other liquid handling systems of the apparatus.

The developing station may also comprise at least one sensor which may be used to control a property of the liquid. The properties of the liquid to be controlled are selected form the group comprising the temperature, the viscosity, the pH, the solids content, the color, the turbidity, the density or combinations thereof. Preferably the temperature, the viscosity and/or the pH are measured. The temperature may be measured by e.g. liquid thermometer, a thermocouple, a thermistor, a Resistance Temperature Detector (RTD), a pyrometer or using infrared. The viscosity may be measured e.g. an Ostwald viscometers, a Höppler viscometer (falling ball), vibrational or rotating viscometers (Brookfield), a bubble viscometer, by determination of pressure loss within built in measuring circle or combinations thereof. The pH may be measured by potentiometric pH meter. The at least one sensor may be may be connected to a control system which may use the measured data in a feedback loop to control the process. Viscosity and pH measurements may be used to determine when and how much of the liquid needs to be replaced in order to obtain consistent development. The developing station may comprise a heating or cooling means constructed such that a temperature of a liquid in the respective station may be controlled independently from other stations.

The advantage of the combination of a pre-cleaning station and a developing station with rotating drum is that two different liquids can be used at two different temperatures and processing speeds. In addition, the pre-cleaning station can be smaller in size and operate at a higher speed than the developing station because the amount of mask layer which has to be removed is much smaller than the amount of relief layer to be removed. Hence the whole device can be smaller which saves space.

After the developing step finished the fixation of the precursor on the drum is released and the precursor is moved towards the second transportation mechanism while rotating the drum. The second transport mechanism moves the precursor to and through following treating stations. The second transport mechanism may comprise one or more transport rollers which transport the precursor by friction and such rollers may be fixed on above, underneath or both sides of the precursor. The second transportation mechanism may use a transport or clamping bar to which the precursor is attached. The transport bar may be moved by two endless chains that carry a fixation means for the transport bar. Another possibility may is to use two rotating spindles in combination with the corresponding shape of the end of the transport bar. Another possibility is to use a conveyor belt onto which the precursor is attached to. The second transport mechanism may also be any combination of the possibilities mentioned above. Preferably at least one transport roll is used as transport mechanism. The second transport mechanism may be connected to a control system which steers the speed and action of the transport system. The speed of the precursor moved by the second transport mechanism is preferably 10 mm/min to 2000 mm/min, more preferably from 20 mm/min to 1500 mm/min, even more preferably from 50 mm/min to 1000 mm/min and most preferred from 100 mm/min to 1000 mm/min. The speed of precursor in the second transport mechanism may be the same or different than the speed of precursor in the first transport mechanism. Both speeds may be independently controlled by the control system.

The post-cleaning station may be identical or different to a pre-cleaning station and may comprise the same units and components (liquid handling system, dispensing unit, at least one further brush, sensor, trough, ultrasound generator, heating/cooling device) as the pre-cleaning station described above. The post-cleaning station and the components may be connected to the control system and can be controlled independently.

The wiping station may be identical or different to a post cleaning station and may comprise the same units and components (liquid handling system, dispensing unit, at least one further brush, sensor, trough, ultrasound generator, heating/cooling device) as the pre-cleaning station describe above, however the purpose is different. While the cleaning stations shall remove material from the plate precursor, the wiping station shall remove excess liquid. In order to do so only little amounts of liquid are dispensed onto the at least one further brush in order to moisten it. Only moistened brushes can remove liquid by capillary forces in the voids between the bristles. The post-cleaning station and the components may be connected to the control system and can be controlled independently. The post cleaning station and the wiping station may be combined in one station, e.g. by a combination of brushes with different dispensing units. The use of a wiping station has the advantage that less liquid needs to be removed in a drying step which can shorten the drying time considerably.

The drying station allows the complete removal of the liquid. This may be achieved by heating or by reducing pressure or a combination of both whereby the evaporation of the liquid is accelerated. Heating may be achieved with an oven, hot gas (preferably air or steam), irradiation with IR light, irradiation with microwaves or combinations thereof. Reduction of pressure may be achieved by ventilation, vacuum pumps (e.g. diffusion pump, aspirator pump, oil pump etc.) a Venturi tube or combinations thereof. Preferably heating with IR lamps or hot air is used for the drying. The developed precursor may be moved through the drying station with the second transportation mechanism or may be conveyed in a chamber with an additional third transport mechanism. The third transport mechanism may be a lift, paternoster or a robot. The developed precursors may also be delivered to separate compartments inside a chamber and remain there for a pre-determined time before they may get transported further to a next treating station. The components of the drying station are connected to a control system which can steer the temperature, duration of drying, the action and speed of the third transport mechanism, exhaust fan or vacuum pump or combinations thereof. Drying takes place preferably at a temperature of 40° C. to 200° C., preferably at 50° C. to 160° C., more preferably at 50° C. to 100° C., most preferably at 50° C. to 80° C. Where the dimensionally stable support of the flexographic printing element is a metal support, drying may also take place at higher temperatures, up to around 160° C.

The post post-exposure station may be used to make the surface of the developed precursor non-tacky and/or to further cure the photo curable relief layer. In this station the developed precursor is treated with electromagnetic rays, preferably using UVA or UVC light. As light sources fluorescent lamps, LEDs or flash lamps or combinations of several of these light sources may be used. Preferably, LEDs or fluorescent lamps are installed. The light sources can be connected to a control system which steers the exposure time, the wavelength in case light sources with different emission spectra are installed, the light intensity or combinations thereof.

Also a storage station may be attached to the apparatus in which developed precursors may be stored in separate sections. The components of the storage station are connected to the control system which steers the movement of the developed precursors and their location within the station.

A cutting station attached to the apparatus can be used to cut larger developed precursors into smaller pieces. The components of the cutting station are connected to the control system which steers the movement of the cutting means.

The apparatus comprises a control system which may be connected to all components of the stations in order to get information of their status and also to control their actions. The status information may be visualized for an operator and may be stored electronically to be able to record and analyze the data. In addition the control system may be able to accept orders from an operator and communicate these to the different components. An order might be given as a single order or by a set of orders in a certain sequence and it may be generated and stored electronically. The control system may comprise a computer, a screen or other means for visualization, a speaker and/or a microphone or other means for acoustic signals and communication. The computer may be connected to converters which transfer the digital computer signals into analog or digital signals that may be reads and understood by the components. In particular the speed of transport, temperatures, drum speed, speed of rotation/oscillation of brushes, liquid handling system and sensors may be recorded and controlled by the control system.

A further aspect of the invention relates to a method for developing printing precursors which comprise at least one imageable layer and at least one relief-forming layer using the apparatus described above comprising the steps:

i. feeding the precursor into the apparatus and transporting the precursor through the pre-cleaning station, wherein the imageable layer is removed in the pre-cleaning station by treating the precursor with a first liquid, ii. attaching the precursor to the rotating drum of the developing station, iii. removing of non-polymerized parts of the relief-forming layer by treating the precursor with a second liquid while rotating the drum, iv. detaching the precursor from the drum.

Preferably, the method further comprises the step v. transporting the precursor through the post-cleaning station, wherein the precursor is treated with a third liquid.

Preferably, the first liquid, the second liquid and/or the third liquid are the same or different and are selected from the group comprising organic solvents, alcohols, water and mixtures of at least two of these components.

Preferably, the temperature of the first liquid, the second liquid and/or the third liquid are regulated to the same temperature or to different temperatures.

Preferably, the method further comprises the step vi. transporting the precursor through at least one post-processing station, wherein at least one post-processing step is performed, the post-processing step being selected from the group comprising drying, post exposure with electromagnetic radiation, cutting, mounting, printing and combinations thereof.

The nature of the liquid used is guided by the nature of the precursor employed. If the imageable layer to be removed is soluble, emulsifiable or dispersible in water or aqueous solutions, water or aqueous solutions might be used as first liquid in the pre-cleaning station. Is the imageable layer soluble, emulsifiable or dispersible in organic solvents or mixtures, organic solvents or mixtures may be used as second liquid in the pre-cleaning station. If the precursor has an aqueously developable photopolymerizable layer, then water or predominantly aqueous solvents can be used as second liquid in the developing station. In the case of organically developable precursors different organic solvents or their mixtures may be used as second liquid in the developing station. Correspondingly the post-cleaning station may be operated with water, aqueous solution, organic solvent or mixtures of organic solvents depending on the nature of the relief layer to be cleaned as a third liquid.

The liquids which can be used in the pre-cleaning station, the developing station, the post-cleaning station and the wiping station should be able to dissolve or disperse or emulsify at least a part or an ingredient of the precursor. In the post-cleaning station and wiping station also liquids may be used that cannot dissolve or disperse or emulsify at least a part or an ingredient of the precursor, but are able to remove material by the mechanical action of a liquid flow or liquid stream.

The liquids may be water or aqueous solutions which may contain other ingredients e.g. salts, acids, bases, emulsifiers, dispersion aids, viscosity regulators, surfactants or combinations thereof. Salts, acids and bases may be used to control the pH of the liquid. Emulsifiers and dispersion aids may be used to enhance the capacity of material uptake of the liquids and stabilize such emulsions and dispersions. The aqueous solutions may comprise organic solvents, e.g. alcohols, esters, ethers; or hydrocarbons or combinations thereof.

The liquids may be organic solvents or mixtures thereof. For example, use may be made of developers comprising naphthenic or aromatic petroleum fractions in a mixture with alcohols, such as benzyl alcohol, cyclohexanol, or aliphatic alcohols having 5 to 10 carbon atoms, for example, and also, optionally, further components, such as, for example, alicyclic hydrocarbons, terpenoid hydrocarbons, substituted benzenes such as diiso-propylbenzene, esters having 5 to 12 carbon atoms, or glycol ethers, for example. Suitable washing agents are disclosed in EP-A 332 070 or EP-A 433 374, for example. In addition the solvents and solvent mixtures may comprise other ingredients e.g. salts, acids, bases, emulsifiers, dispersion aids, viscosity regulators, antistatics, water, surfactants or combinations thereof. For reasons of safety and to reduce the cost and complexity of the apparatus involved, the temperature when using organic solvents ought to be 5° C. to 15° C. beneath the flash point of the washing agent mixture used.

A further aspect of the invention concerns a printing precursor obtained by a method according to one of the methods described above.

The printing precursor may contain at least a dimensionally stable substrate, a relief layer and an imageable mask layer. Optionally further layer(s) may be present. There may be a cover layer at the top of all other layers which is removed before the imageable layer is imaged. There may be an antihalation layer between the substrate and the relief layer or it may be located at the side of the substrate which is opposite of the relief layer. There may be one or more barrier layers between the relief layer and the imageable layer which prevent diffusion of oxygen. Between the different layers described above adhesion layers may be located which ensure proper adhesion of the different layers. The layers may be removable by treatment with a liquid. The liquids used may be the same or different for each different layer. Preferably the liquids used are different.

BRIEF DESCRIPTION OF THE FIGURES

The following FIGURE shows a schematic view of an embodiment of the inventive apparatus.

FIG. 1 shows a schematic view of an example embodiment of the inventive apparatus 10. The apparatus 10 comprises a pre-cleaning station 30, a developing station 20 and a post-processing station 40. A first transport mechanism 12 is provided for transporting a precursor 11 through the pre-cleaning station 30 and to the developing station 20. The developing station 20 comprises a rotating drum 22 having a fixation mechanism 24 for the precursor 11 and a plurality of first brushes 26. The precursor 11, which is processed in the example embodiment of the apparatus 10, comprises an imageable layer and a relief-forming layer.

The pre-cleaning station 30 comprises a first liquid handling system having a dispensing unit 54 and a trough 52. The first liquid handling system applies a first liquid to a further brush 50 of the pre-cleaning station 30. The used liquid is collected by the trough 52. When the precursor 11 is moved through the pre-cleaning station 30, the imageable layer of the precursor 11 is removed using the first liquid which is applied to the precursor 11 by means of the further brush 50.

After passing the pre-cleaning station 30, the precursor 11 is attached to the rotating drum 22 of the developing station 20 by means of the fixation mechanism 24. The developing station 20 comprises a second liquid handling system having a dispensing unit 54 and a trough 52. Non-polymerized parts of the relief-forming layer of the precursor 11 are removed in the developing station 20 by means of a second liquid while the drum 22 is rotated. A plurality of first brushes 26 is used to apply the second liquid.

After the non-polymerized parts of the relief-forming layer have been removed, the precursor 11 is detached from the drum 22 by releasing the fixation mechanism 24 and is then transported through the optional post-processing station 40 by means of a second transport mechanism 14. The post-processing station 40 of the depicted example embodyment is configured as a post-cleaning station and comprises a third liquid handling system having a dispensing unit 54 and a trough 52. The third liquid handling system applies a third liquid to a further brush 50 of the post-processing station 40 so that the precursor 11 is treated with the third liquid in the post-processing station 40. After the treatment is complete, the second transport mechanism 14 transports the precursor 14 out of the post-cleaning processing 40.

EXAMPLES

As printing precursors NEF 170 (Flint group Germany) which carry an alcohol soluble laser ablatable layer, having a thickness of 170 μm and a plate size of 2032×1320 mm were used. The laser ablatable layer contained 12.6 parts by weight of carbon black and 23.4 parts by weight of a polyamide. The plates were image wise ablated with a Thermoflex TFX 80 (Xeikon) under the following conditions: 352 rpm drum speed, at 80 W laser power, corresponding to 4.4 J/cm$^2$ for a resolution of 4000 dpi.

After the ablation the precursors were exposed to UV radiation using a NExT FV exposure (Flint Group Germany) equipped with UVA LEDs emitting at 365 nm. The precursors were irradiated form the back side for 35 seconds using UVA fluorescent lamps emitting at 365 nm and a power of 22 mw/cm$^2$, followed by an exposure through the laser ablated layer using the LEDs at a power of 800 mw/cm$^2$ scanning the LED bar 2 times at 1000 mm/min followed by 2 times with 200 mm/min.

Such plates were then developed according to the following methods.

After development drying was performed in a nyloflex FV dryer for 45-120 min at 60° C. Post exposure was performed in a nyloflex FV Lightfinisher, for 10 min.

Comparative Example C1

The printing precursor was developed without pre-cleaning and using a state of the art developer nyloflex FV RB washer (Flint Group Germany) at a speed of 500 mm/min and with the nylosov A at 35° C. The total processing time in this case was normalized and set to 1. The precursor was dry but in some cases tiny black spots form the ablatable layer. The processing solution was turning dark and grey and the plate was contaminated with black spots.

Example E1

The plate was fed into the apparatus of the invention at a speed of 500 mm/min passing a pre-cleaning station which rinsed the precursor with liquid 1 (=nylosolv A) at a temperature of 35° C. While the precursor was moving it was fixed on the drum with a clamp and transported into the developing station. The uncured portion of the precursor was removed by rotating the drum 25 times at a speed of 5 rpm. As liquid 2 nylosolv A was used at a temperature of 35° C. also. The rotating brush was rotating in the opposite direction than the drum at a speed of 20 rpm. Then the clamp was opened and the plate left the apparatus. The dried precursor was clean and nicely developed and did print well. Total normalized processing time was 0.8.

Example E2

The procedure of example E1 was repeated except that the temperature of the pre-cleaning and the developing station were different in the pre-cleaning station it was 35° C. and in the developing station it was 20° C. The uncured portion of the precursor was removed by rotating the drum 35 times at a speed of 5 rpm.

The dried precursor was clean and nicely developed and did print well. Total normalized processing time was 1.

Example E3

The procedure of example E1 was repeated except that liquid 1 for pre-cleaning pure cyclohexanol and liquid 2 for developing nylosolv A were used and both solvents were at 35° C. In this case the speed in the pre-cleaning station could be doubled.

The dried precursor was clean and nicely developed and did print well. Total normalized processing time was 0.65.

Example E4

The procedure of example E1 was repeated except that liquid 1 for pre-cleaning pure cyclohexanol at 20° C. and liquid 2 for developing nylosolv A at 35° C. were used. The speed in the pre-cleaning station had to be lowered (700) but was still faster than when using nylosolv A.

The dried precursor was clean and nicely developed and did print well. Total normalized processing time was 0.71.

Example E5

The procedure of example E1 was repeated except that liquid 1 for pre-cleaning pure cyclohexanol at 35° C. and liquid 2 for developing nylosolv A at 20° C. were used. The dried precursor was clean and nicely developed and did print well. Total normalized processing time was 0.85.

Example E6

The procedure of example E3 was repeated except that the plate passed a post treatment station and a wiping station at the same speed as used for in the pre-cleaning station of 1000 mm/min. In the post treatment station the pate was rinsed with nylosolv A at 35° C. and in the wiping station solvent remaining on the plate was removed with a dry rotating brush at 20 rpm (solvent is removed from the brush with a doctor blade).

The dried precursor was clean and nicely developed and did print well. Total normalized processing time was 0.8.

Results are summarized in Table 1.

TABLE 1

| Ex. | liquid 1/ temperature | liquid 2/ temperature | liquid 3/ temperature | total processing time normalized to C1 | equipment length normalized to C1 | Cleanness | Contamination |
|---|---|---|---|---|---|---|---|
| C1 |  | nylosolv A/ 35° C. |  | 1 | 1 | poor | high |
| E1 | nylosolv A/35° C. | nylosolv A/ 35° C. |  | 0.8 | 0.26 | good | no |
| E2 | nylosolv A/35° C. | nylosolv A/ 20° C. |  | 1 | 0.26 | very good | no |
| E3 | cyclohexanol/ 35° C. | nylosolv A/ 35° C. |  | 0.65 | 0.26 | very good | no |
| E4 | cyclohexanol/ 20° C. | nylosolv A/ 35° C. |  | 0.71 | 0.26 | very good | no |
| E5 | cyclohexanol/ 35° C. | nylosolv A/ 20° C. |  | 0.85 | 0.26 | very good | no |
| E6 | cyclohexanol/ 35° C. | nylosolv A/ 35° C. | nylosolv A/ 35° C. | 0.8 | 0.26 | very good | no |

From the above results it is obvious that the apparatus and methods employing it results in clean precursors, with reduced processing time, reduced space requirement and reduction of contamination of the liquids.

Example E7

On a NEF 170 (Flint group Germany) precursor, with a thickness of 170 μm and a plate size of 2032×1320 nm, a water soluble laser ablatable layer was applied. The laser ablatable layer contained 40 parts by weight of carbon black and 60 parts by weight of a partially hydrolyzed vinyl acetate/ethylene oxide graft copolymer. The plates were image wise ablated with a Thermoflex TFX 80 (Xeikon) under the following conditions: 352 rpm drum speed, at 80 W laser power, corresponding to 4.4 J/cm² for a resolution of 4000 dpi.

After ablation the precursors were exposed to UV radiation using a NExT FV exposure (Flint Group Germany) equipped with UVA LEDs emitting at 365 nm. The precursors were irradiated form the back side for 35 seconds using UVA fluorescent lamps emitting at 365 nm and a power of 22 mw/cm², followed by an exposure through the laser ablated layer using the LEDs at a power of 800 mw/cm² scanning the LED bar 2 times at 1000 mm/min followed by 2 times with 200 mm/min.

Such plates could not be developed in a state of the art developer nyloflex FV RB washer (Flint Group Germany) because the water soluble laser ablatable layer could not be removed.

Plates were fed into the apparatus of the invention at a speed of 500 mm/min passing a pre-cleaning station which rinsed the precursor with solvent 1 being water at a temperature of 35° C. While the precursor was moving it was fixed on the drum with a clamp and transported into the developing station. The uncured portion of the precursor was removed by rotating the drum 25 times at a speed of 5 rpm. As liquid 2 nylosolv A was used at a temperature of 35° C. also. The rotating brush was rotating in the opposite direction than the drum at a speed of 20 rpm. Then the clamp was opened and the plate left the apparatus. The dried precursor was clean and nicely developed and did print well.

The invention claimed is:

1. An apparatus for developing printing precursors comprising
   a developing station, the developing station comprising a rotating drum having a fixation mechanism for the precursor and at least one first brush,
   wherein the apparatus further comprises a pre-cleaning station, a first transport mechanism and a second transport mechanism, the first transport mechanism being configured for transporting the precursor through the pre-cleaning station and, after the precursor has passed the pre-cleaning station, to the rotating drum of the developing station, wherein the apparatus is configured
   to attach one or several precursors to the rotating drum by means of the fixation mechanism,
   to rotate the rotating drum at least once during developing,
   to release a fixation of the one or several precursors on the rotating drum after developing has finished and
   after the fixation has been released, to move the one or several precursors towards the second transportation mechanism while rotating the rotating drum.

2. The apparatus of claim 1, wherein the apparatus further comprises at least one post-processing station selected from the group consisting of a post-cleaning station, a wiping station, drying station, post exposure station, storage station, cutting station and combinations thereof, and
   the second transport mechanism being configured for transporting the precursor from the developing station through the at least one post-cleaning station.

3. The apparatus of claim 1, wherein the pre-cleaning station, the developing station and/or the post-cleaning station comprise a dispensing unit, and wherein the pre-cleaning station, the developing station and/or the post-cleaning station have liquid handling systems which are independent from each other or comprise a common liquid handling system.

4. The apparatus of claim 3, wherein the pre-cleaning station, the developing station and/or the post-cleaning station comprise heating and/or cooling means constructed such that a temperature of a liquid in the respective station may be controlled independently from other stations.

5. The apparatus of claim 1, wherein the fixation mechanism is selected from the group consisting of a clamping mechanism, a holding unit for a transport bar, a vacuum system and combinations thereof.

6. The apparatus of claim 1, wherein the pre-cleaning station and/or the post-cleaning station comprise at least one unit selected from the group consisting of at least one further brush, a knife, an air knife, a rotary cutter, a grinding unit, a squeeze unit, an ultrasonic bath and combinations thereof.

7. The apparatus of claim 6, wherein the pre-cleaning station and/or the post-cleaning station comprise at least a front brush and a back brush, wherein the front brush is arranged to contact a front side of the precursor and the back brush is arranged to contact an opposing back side of the precursor.

8. The apparatus of claim 1, wherein the at least one first brush of the developing station, at least one further brush of the pre-cleaning station and/or at least one further brush of the post-cleaning station is arranged such that a distance between the respective brush and the precursor and/or a pressure exerted by the respective brush onto the precursor is independently controllable.

9. The apparatus of claim 1, wherein the at least one first brush of the developing station, at least one further brush of the pre-cleaning station and/or at least one further brush of the post-cleaning station is constructed as a rotating brush and/or an oscillating brush.

10. The apparatus of claim 1, wherein the apparatus is configured for developing printing precursors which are configured as plate-form printing elements and in that the pre-cleaning station and/or the post-cleaning station are configured as flatbed washers.

11. The apparatus of claim 1, wherein the pre-cleaning station and a developing station with rotating drum can have two different liquids that can be used at two different temperatures and different processing speeds.

12. The apparatus of claim 1, wherein the pre-cleaning station is smaller in size than the developing station and operates at a higher speed than the developing station.

13. A method for developing printing precursors which comprise at least one imageable layer and at least one relief-forming layer using the apparatus of claim 1 comprising the steps:
   i. feeding the precursor into the apparatus and transporting the precursor through the pre-cleaning station, wherein the imageable layer is removed in the pre-cleaning station by treating the precursor with a first liquid,
   ii. attaching the precursor to the rotating drum of the developing station,
   iii. removing of non-polymerized parts of the relief-forming layer by treating the precursor with a second liquid while rotating the drum, and
   iv. detaching the precursor from the drum.

14. The method of claim 13, wherein the method further comprises the step
   v. transporting the precursor through the post-cleaning station, wherein the precursor is treated with a third liquid.

15. The method of claim 13, wherein the first liquid, the second liquid and/or the third liquid are the same or different and are selected from the group comprising organic solvents, alcohols, water and mixtures of at least two of these components.

16. The method of claim 13, wherein the temperature of the first liquid, the second liquid and/or the third liquid are regulated to the same temperature or to different temperatures.

17. The method of claim 13, wherein the method further comprises the step
   vi. transporting the precursor through at least one post-processing station, wherein at least one post-processing step is performed, the post-processing step being selected from the group comprising drying, post exposure with electromagnetic radiation, cutting, mounting, printing and combinations thereof.

18. The method of claim 13, wherein the printing precursor is configured as a plate-form printing element.

\* \* \* \* \*